(12) United States Patent
Kim

(10) Patent No.: US 6,563,170 B2
(45) Date of Patent: *May 13, 2003

(54) INSULATED GATE BIPOLAR TRANSISTOR

(75) Inventor: Tae-hoon Kim, Kyungki-do (KR)

(73) Assignee: Fairchild Korea Semiconductor Ltd., Kyonggi-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/175,424

(22) Filed: Oct. 20, 1998

(65) Prior Publication Data

US 2001/0020719 A1 Sep. 13, 2001

(30) Foreign Application Priority Data

Oct. 22, 1997 (KR) .......................... 1997-54216

(51) Int. Cl.⁷ .................. H01L 29/76; H01L 29/94; H01L 29/74; H01L 31/111
(52) U.S. Cl. .................. 257/341; 257/328; 257/133; 257/139
(58) Field of Search ................ 257/328, 341, 257/133, 139

(56) References Cited

U.S. PATENT DOCUMENTS 5,321,295 A * 6/1994 Hisamoto ............... 257/341
5,703,383 A * 12/1997 Nakayama ............. 257/341

FOREIGN PATENT DOCUMENTS

EP 0823735 A1 * 2/1998 .............. 257/341

* cited by examiner

Primary Examiner—Steven Loke
(74) Attorney, Agent, or Firm—Volentine Francos, PLLC

(57) ABSTRACT

An insulated gate bipolar transistor (IGBT) and a method for manufacturing the same is provided. This method is capable of preventing a latch-up and improving a short current characteristic. In the IGBT, a second conductive type semiconductor layer is formed over a semiconductor substrate. A first conductive type well is then formed beneath the surface of the semiconductor layer, and a second conductive type source region doped with a high concentration is formed in the well. Also, a gate electrode is formed over the semiconductor layer, but so as not to contact the source region in a region in which a contact between the source region and a cathode electrode is formed. Also, the IGBT further includes an impurity region for controlling latch-up, the impurity region being extended to a part of the semiconductor layer via the well.

3 Claims, 12 Drawing Sheets

INSULATED GATE BIPOLAR TRANSISTOR

This application relies for priority upon Korean Patent Application No. 97-54216, filed on Oct. 22, 1997, the contents of which are herein incorporated by reference in their entirety.

BACKGROUND OF THE INVENTION

1. Field of the Invention

The present invention relates to a semiconductor device and a method of manufacturing the same, and more particularly, to an insulated gate bipolar transistor (IGBT) and a method of manufacturing the same.

2. Description of the Related Art

Recently, demands have rapidly increased for an inverter used in a logic circuit for a robot or machine tool, an inverter used in industrial electronics as a power device without power failure for office supplies, and an inverter used in a small power converter for the public. In the specific case of a power converter, together with any extension of this application field, the need has increased for a small and light power converter with low noise that provides a high efficiency. However, conventional semiconductor devices such as bipolar junction transistors (BJTs) or a high-power MOS field effect transistors (MOSFETs) cannot satisfy such requirements. Thus, a new semiconductor device has been developed that has both the high-speed switching characteristic of a MOSFET and the high power characteristic of the BJT. This device, an insulated gate bipolar transistor (IGBT), has now become the object of much attention.

The IGBT has a latch-up phenomenon in that the current cannot be controlled by the gate voltage if the current increases. Such latch-up phenomenon is the primary factor for limiting the level of current that enables operation of the IGBT.

In an IGBT having a thyristor structure, if a hole current flowing beneath an $n^+$ source region formed on a $p^-$ well increases, the voltage between the well and the source region is decreased by the resistance of the $p^-$ well. If this difference in voltage is over a predetermined level, a parasitic npnp thyristor comes into operation. When the thyristor operates, it provides an electron current to a pnp transistor. Thus, even if the gate voltage is blocked, the current level is increased via the pnp transistor, rather than the pnp transistor turning off. As a result, the temperature of the IGBT increases, leading to the breakdown of the IGBT.

These serial operations refer to the latch-up phenomenon. In order to prevent this latch-up phenomenon, the controllable current level is increased and an accumulated carrier is rapidly removed at the same time for a high-speed operation. This is a key for making the IGBT practical.

On the other hand, when a power semiconductor device is used to drive a motor, a saturation current, which is about 4~5 times higher than the actual operation current, flows if the motor is overloaded. Because of the heat generated by this much current, the efficiency of the emitter in a power semiconductor device increases. As a result, many holes are injected into the semiconductor device, resulting in a latch-up phenomenon. This phenomenon is called a "short circuit current" or a "thermal latch-up".

Many suggestions have been provided to supply a large current by preventing the above latch-up phenomenon. Particularly, a structure has been widely used in which a $p^+$ well is formed in a $p^-$ well using an ion implantation method. A conventional IGBT having such a structure will be described briefly with reference to FIGS. 1 through 3.

FIG. 1 is a layout of a conventional IGBT capable of preventing the latch-up phenomenon.

As shown in FIG. 1, reference numeral 100 represents a first mask pattern for forming a gate electrode; reference numeral 110 represents a second mask pattern for forming a $p^+$ well region to remove the latch-up; reference numeral 120 represents a third mask pattern for forming a $n^+$ source region; and reference numeral 130 represents a mask pattern for forming a contact hole that connects a metal electrode with the source region and well region formed in a semiconductor substrate, respectively.

FIGS. 2 and 3 are section views of the conventional IGBT shown in FIG. 1, cut along line II-II' and line III-III', respectively.

Referring to FIGS. 2 and 3, an $n^+$ buffer layer 4 with a high concentration is formed over a $p^+$ semiconductor substrate 2. Also, an $n^-$ semiconductor layer 6 with a low concentration is grown over the $n^+$ buffer layer 4 by an epitaxial growth method. A gate electrode 10 made of a polysilicon layer is formed over the $n^-$ semiconductor layer 6 while a gate dielectric film 8 is interposed between the gate electrode 10 and the $n^-$ semiconductor layer.

A $p^-$ well region 12 is formed by impurity ion implantation and thermal diffusion beneath the surface of the $n^-$ semiconductor layer 6, between the gate electrodes 8. Also, in order to prevent the latch-up, a $p^+$ well region 14 with a high concentration is formed by ion implantation and thermal diffusion, passing through the center of the $p^-$ well region 12 (see FIG. 2) and extended to a part of the $n^-$ semiconductor layer 6.

Also, an $n^+$ source region 16 is formed beneath the surface of the $p^-$ well region 12 and the $p^+$ well region 14 using a mask for the source. A metal electrode 20 used as a cathode is formed on the surface of the $n^+$ source region 16 and $p^+$ well region 14. Here, reference numeral 18 represents a dielectric film for electrical insulation between the metal electrode 20 and the gate electrode 10.

In the conventional IGBT described above, the resistance between the $p^-$ well region 12 and the $n^+$ source region 16 is decreased by the $p^+$ well region 14, which is formed to pass through the $p^-$ well region 12. Thus, the difference in voltage between the source region 16 and the well regions 12 and 14 is decreased, thereby improving the latch-up phenomenon.

However, according to the above conventional IGBT, electron current and hole current both flow in the same direction, collecting in an emitter contact where the metal electrode 20 contacts the $n^+$ source region (see FIG. 3). Thus, if the concentration of the $p^-$ well region 12 is low, the hole current is multiplied by the resistance of the $p^-$ well region, thereby causing a voltage drop in the $p^-$ well region 12 beneath the $n^+$ source region 16. As a result, it is difficult to prevent the latch-up of the IGBT, and the short circuit current characteristics of this circuit are deteriorated.

SUMMARY OF THE INVENTION

To solve the above problems, it is a first object of the present invention to provide an insulated gate bipolar transistor (IGBT) that is capable of improving the control of latch-up and short circuit current characteristics.

It is a second object of the present invention to provide a method for manufacturing this IGBT.

To achieve the first object, there is provided an insulated gate bipolar transistor (IGBT). In the IGBT, a semiconductor layer of a second conductive type is formed over the semiconductor substrate. A well of the first conductive type is then formed beneath the surface of the semiconductor layer. A source region of the second conductive type is formed in the well and doped with a high concentration. And a gate electrode is formed over the semiconductor layer. The gate electrode only contacts the source region outside of a cathode region in which a contact between the source region and a cathode electrode is formed.

Preferably the IGBT also comprises an impurity region of the first conductive type for controlling latch-up, the impurity region being extended to a part of the primary semiconductor layer via the well. The IGBT may also comprise a highly-doped semiconductor layer of the second semiconductor type, formed over the semiconductor substrate. The IGBT may also comprise an impurity region of the first conductive type for controlling latch-up, the impurity region being extended to a part of the primary semiconductor layer via the well.

In addition, the IGBT may comprise an interlayer dielectric (ILD) film formed over the gate electrode, and a cathode electrode electrically insulated from the gate electrode by the ILD film, and connected to the source region and the well.

The first conductive type may be p-type and the second conductive type n-type, or the first conductive type may be n-type and the second conductive type p-type.

According to an aspect of the second object, there is provided a method for manufacturing an insulated gate bipolar transistor (IGBT), comprising the steps of forming a primary semiconductor layer of a second conductive type over a semiconductor substrate of a first conductive type, forming a plurality of gate electrodes over the primary semiconductor layer, the plurality of gate electrodes being separated by a predetermined distance, forming at least one well of a first conductive type in the primary semiconductor layer, between the plurality of gate electrodes, and forming a source region of a second conductive type in the well, wherein the source region only contacts the gate electrode outside of an emitter contact region.

The method for manufacturing an IGBT may also comprise the step of forming a highly-doped semiconductor layer of the second conductive type over the semiconductor substrate. This step is preferably performed before the step of forming a primary semiconductor layer of a second conductive type over a semiconductor substrate of a first conductive type.

The method for manufacturing an IGBT may also comprise the steps of forming a gate dielectric film over the primary semiconductor layer, forming a conductive layer over the gate dielectric film, and patterning the conductive layer and the gate dielectric film in the emitter contact region. The conductive layer and the gate dielectric film are preferably separated from the source region by a predetermined distance.

In addition, the method for manufacturing an IGBT may comprise the step of forming an impurity region in the primary semiconductor layer adjacent to the source region and passing through the well, the impurity region operating to control latch-up. This step is preferably performed before the step of forming a source region of a second conductive type in the well.

The method for manufacturing an IGBT may also comprise the steps of forming an insulation film over the source region, forming a contact hole to expose the well and the source region by partially etching the insulation film, and forming a cathode electrode connected to the source region and the well by forming a metal layer over and in the contact hole. These steps are preferable performed after the step of forming a source region of a second conductive type in the well.

The first conductive type is preferably p-type and the second conductive type is preferably n-type. Preferably, the semiconductor layer is formed by an epitaxial growth method.

According to another aspect of the second object, there is provided a method for manufacturing an insulated gate bipolar transistor (IGBT), comprising the steps of forming a primary semiconductor layer of a second conductive type over a semiconductor substrate of a first conductive type, forming a plurality of patterned conductive layers for a gate over the semiconductor layer, the plurality of conductive layers being separated from each other, forming a well of the first conductive type over the semiconductor layer between the plurality of conductive layers, forming a source region of a second conductive type in the well, each side of the source region being adjacent to one of the plurality of conductive layers, and forming a gate electrode having a region separated by a predetermined distance from the source region by partially etching the plurality of conductive layers.

The method for manufacturing an IGBT preferably comprises the step of forming a highly-doped semiconductor layer of the second conductive type over the semiconductor substrate. This step is preferably performed prior to the step of forming a primary semiconductor layer of a second conductive type over a semiconductor substrate of a first conductive type.

The method for manufacturing an IGBT may also comprise the step of forming an impurity region of the first conductive type in the primary semiconductor layer adjacent to the source region and passing through the well, the impurity region operating to control latch-up. This step is preferably performed before the step of forming a source region of a second conductive type in the well.

The method for manufacturing an IGBT may also comprise the steps of forming an insulation film over the source region, forming a contact hole that exposes the well and the source region by partially etching the insulation film, and forming a cathode electrode connected to the source region and the well by forming a metal layer over and in the contact hole. These steps are preferably performed after the step of forming a gate electrode.

The first conductive type is preferably p-type and the second conductive type is preferably n-type. Preferably, the semiconductor layer is formed by an epitaxial growth method.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

Figure 1:
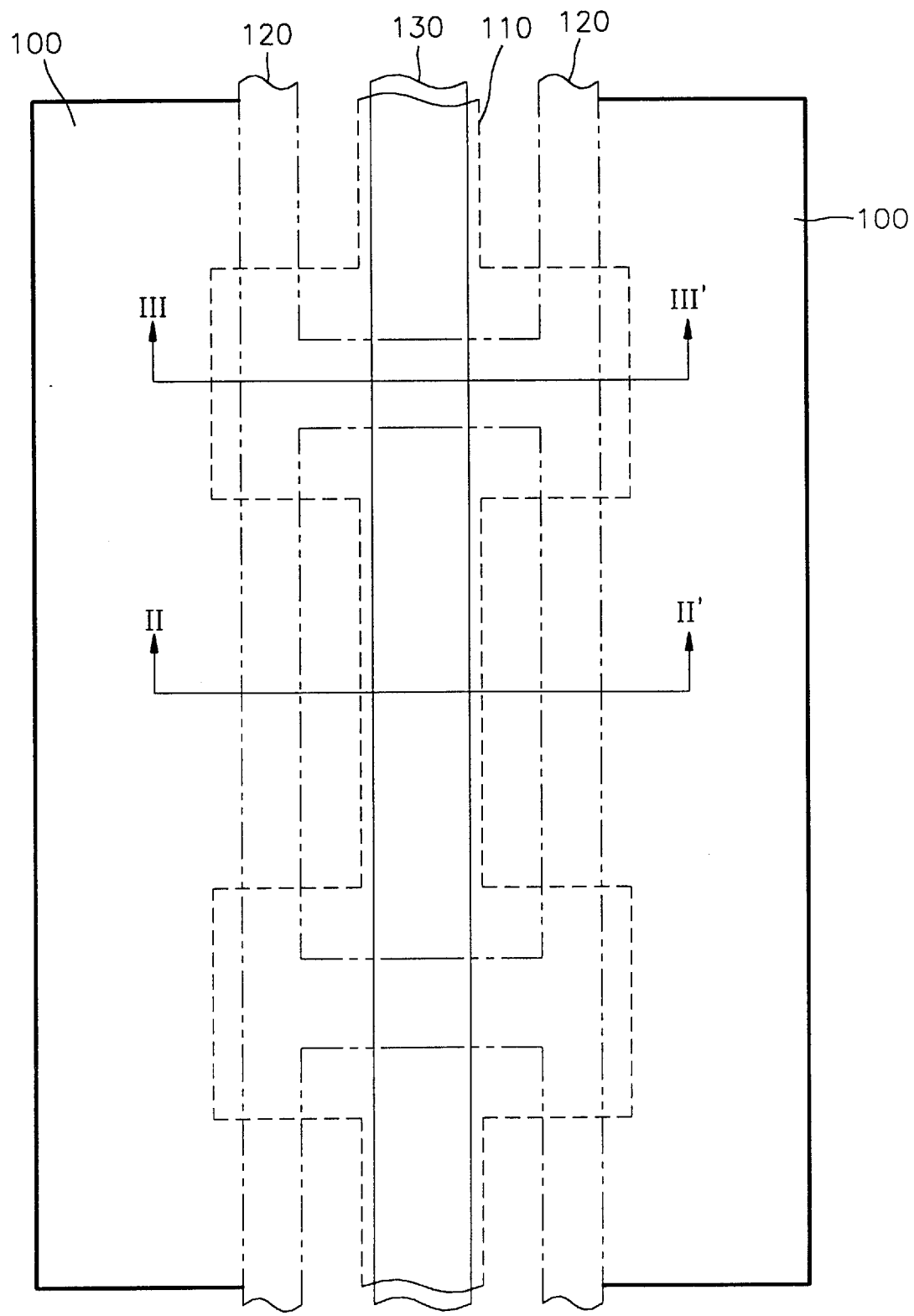
FIG. 1 is a layout of a conventional insulated gate bipolar transistor (IGBT)
Figure 2:
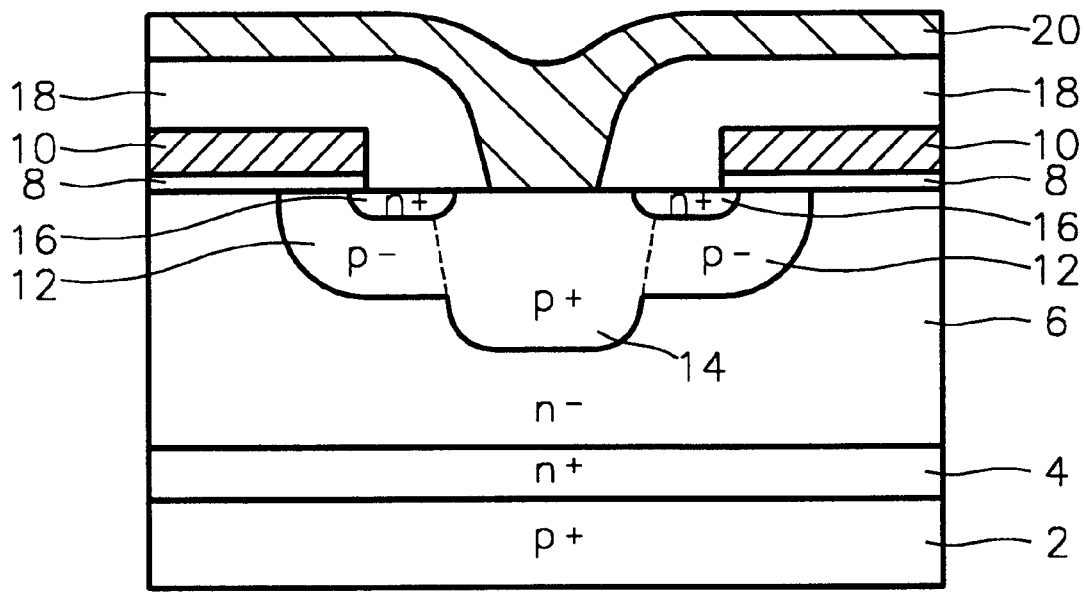
FIG. 2 is a section view of the conventional IGBT shown in FIG. 1, cut along line II-II'.
Figure 3:
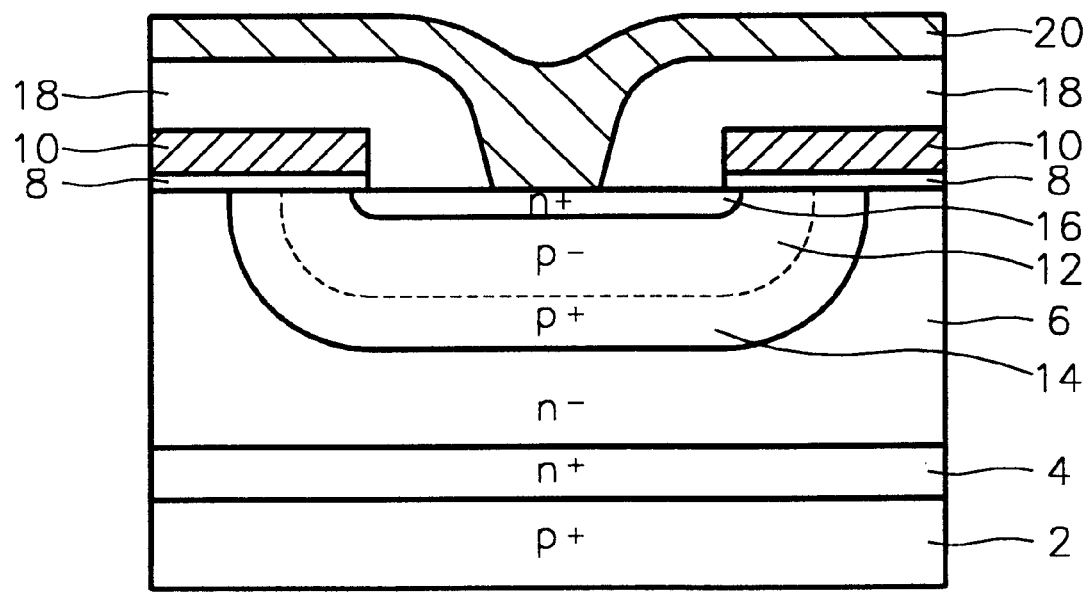
FIG. 3 is a section view of the conventional IGBT shown in FIG. 1, cut along line III-III'.

The present invention now will be described more fully below with reference to the accompanying drawings, in which preferred embodiments of the invention are shown. This invention may, however, be embodied in many different forms and should not be constructed as limited to the embodiments set forth below. Rather, these embodiments are provided so that this disclosure will be thorough and complete, and will fully convey the scope of the invention to those skilled in the art. In the drawings, the thickness of layers and regions are exaggerated for clarity. Like numbers refers to like elements throughout. It will also be understood that when a layer is referred to as being "on" another layer or substrate, it can be directly on the other layer or substrate, or intervening layers may also be present.

Figure 4:
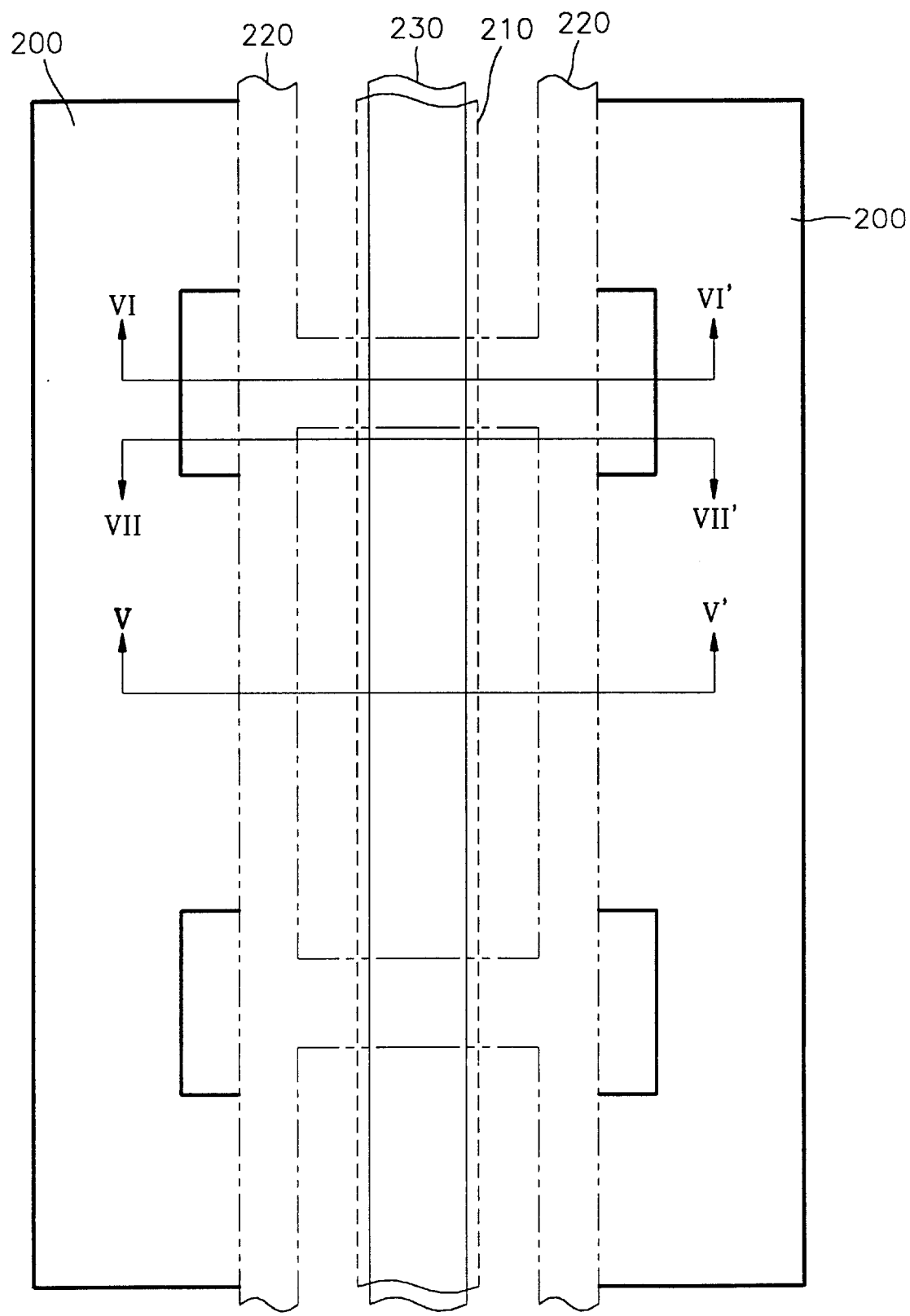
FIG. 4 is a layout of an IGBT according to a preferred embodiment of the present invention.

FIG. 4 is a layout of an IGBT according to a preferred embodiment of the present invention. As shown in FIG. 4, reference numeral 200 represents a first mask pattern for forming a gate electrode; reference numeral 210 represents a second mask pattern for forming a $p^+$ well region; reference numeral 220 represents a third mask pattern for forming a $n^+$ source region; and reference numeral 230 represents a fourth mask pattern for forming a contact hole connecting a metal electrode to a source region and well region formed in a semiconductor substrate, respectively.

Referring to FIG. 4, the first mask pattern 200 is arranged in the emitter contact region to be separate from the third mask pattern 220 for the $n^+$ source region and is formed without contacting the third mask pattern 220. This is for increasing emitter ballast resistance (EBR) in the $n^+$ source region. Since the gate electrode and the $n^+$ source region do not contact, a channel is not formed. Thus, the EBR at this region becomes infinite, so that a threshold voltage also becomes infinite. As a result, current flowing from the $n^+$ source region to the gate electrode is blocked, and the latch-up phenomenon is controlled.

Figure 5:
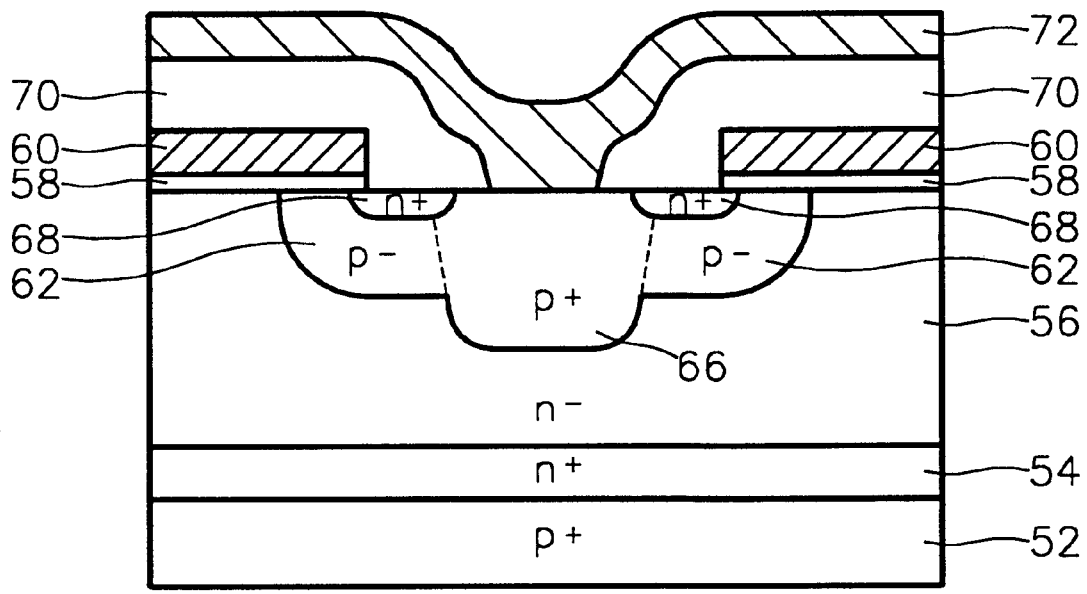
FIGS. 5 through 7 are section views of the IGBT shown in FIG. 4.
Figure 6:
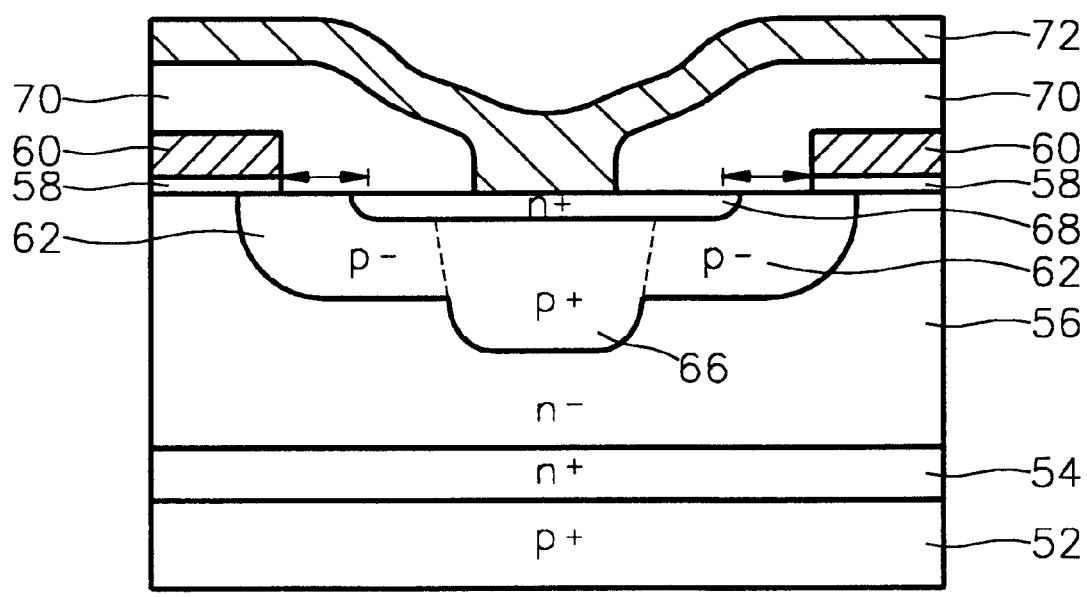
Figure 7:
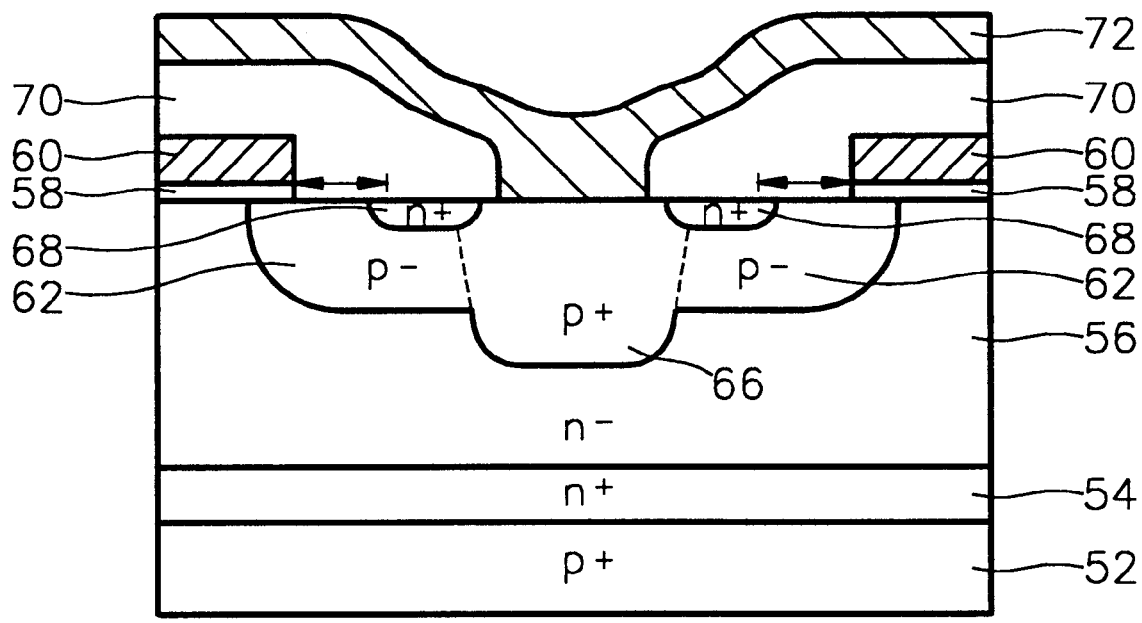

FIGS. 5 through 7 are section views illustrating the IGBT of FIG. 4 according to the preferred embodiment of the present invention, cut along the lines V-V', VI-VI' and VII-VII', respectively.

Referring to FIGS. 5 through 7, an $n^+$ buffer layer 54 is first formed on a $p^+$ semiconductor substrate 52. An $n^-$ semiconductor layer 56 is also grown on the $n^+$ buffer layer 54 by an epitaxial growth method. A gate electrode 60, preferably made of a polysilicon layer, is then formed on the $n^-$ semiconductor layer 56 while a gate dielectric film 58 is interposed between the gate electrode 60 and the $n^-$ semiconductor layer 56.

Referring to FIGS. 6 and 7, which show an emitter contact region, the gate electrode 60 is formed separate from the $n^+$ source region 68. Since the gate electrode 60 and the $n^+$ source region 68 do not come in contact, a channel is not formed. Thus, the threshold voltage at this region becomes infinite, so that current flowing from the $n^+$ source region 68 to the gate electrode 60 is blocked, thereby controlling the latch-up phenomenon.

A $p^-$ well region 62 is formed by ion implantation and thermal diffusion beneath the surface of the $n^-$ semiconductor layer 56, between the gate electrodes 60. In order to prevent the latch-up, a $p^+$ well region 66 with a high concentration is also formed by ion implantation and thermal diffusion. The $p^+$ well region 66 passes through the center of the $p^-$ well region 62 and extends to a part of the $n^-$ semiconductor layer 56.

Also, an $n^+$ source region 68 is formed beneath the upper surface of the $p^-$ well region 62 and the $p^+$ well region 66 using a mask for the source. Here, reference numeral 72 represents a metal electrode contacting the $n^+$ source region 68 or $p^+$ well region 66, and reference numeral 70 represents a dielectric film for electrical insulation between the metal electrode 72 and the gate electrode 60.

FIGS. 8A through 12C are section views illustrating a method for manufacturing the IGBT according to a preferred embodiment of the present invention. In detail, FIGS. 8A, 9A, 10A, 11A and 12A are section views cut along the line V-V' of FIG. 4, and FIGS. 8B, 9B, 10B, 11B and 12B are section views cut along the line VI-VI' of FIG. 4, and FIGS. 8C, 9C, 10C, 11C and 12C are section views cut along the line VII-VII' of FIG. 4. Here, the same reference numerals as those of FIGS. 5 through 7 represent the same parts.

Figure 8A:
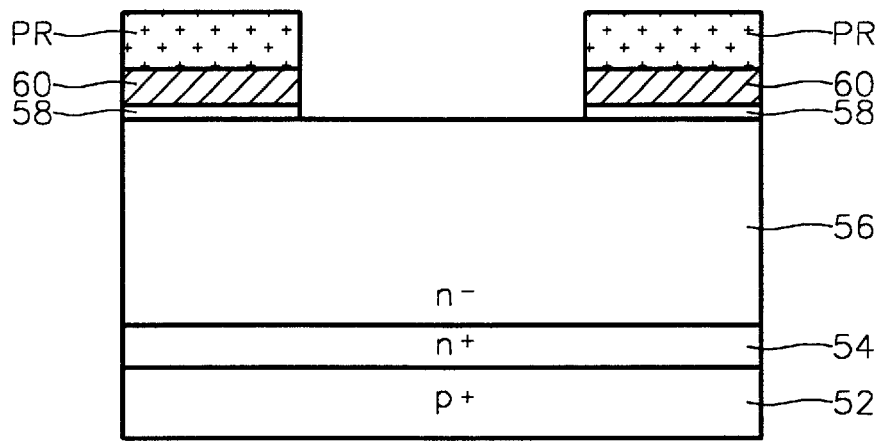
FIGS. 8A through 12C are section views illustrating a method for manufacturing an IGBT according to the preferred embodiment of the present invention.
Figure 8B:
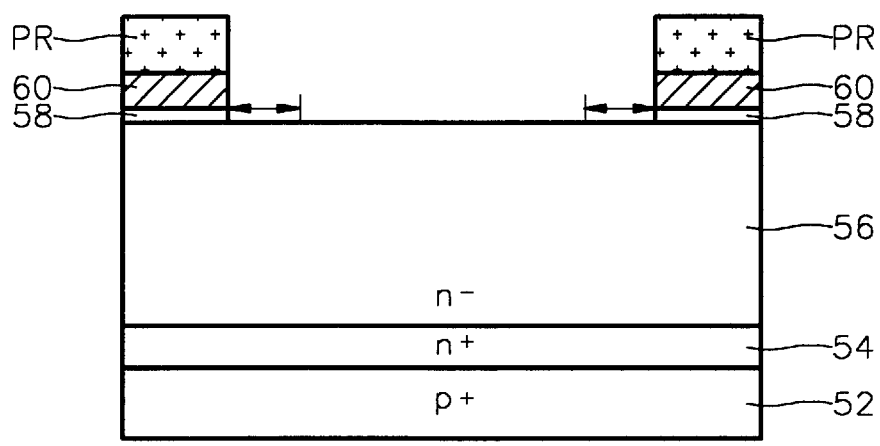
Figure 8C:
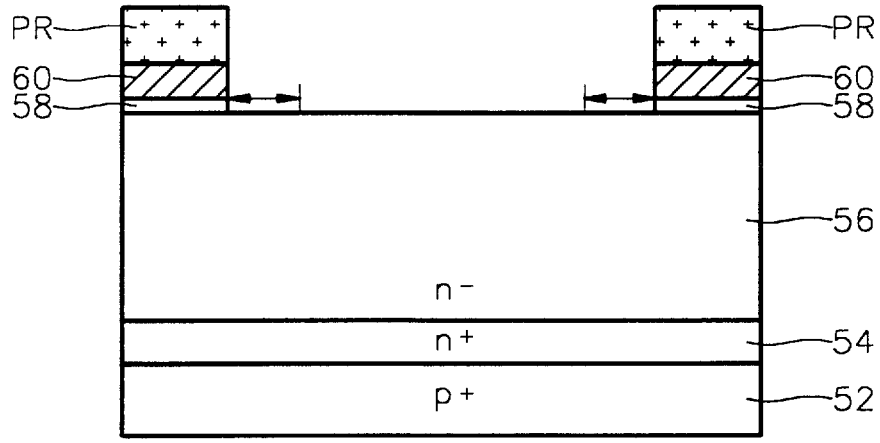

Referring to FIGS. 8A through 8C, an $n^+$ buffer layer 54 and an $n^-$ semiconductor layer 56, which are doped with a second conductive type impurity, e.g., phosphorous ion, are formed in sequence on a semiconductor substrate doped with a high concentration of a first conductive type impurity, e.g., $p^+$ semiconductor substrate 52. A thin thermal oxide film is then grown on the $n^-$ semiconductor layer 56, and a conductive layer for a gate, such as an impurity-doped polysilicon layer, is formed on the thin thermal oxide film.

Next, a photolithography process using the first mask pattern 200 for the gate shown in FIG. 4 is performed to form a photoresist (PR) pattern having an opening in a region in which the $p^-$ well region is to be formed. Then, the polysilicon layer and the thermal oxide film are patterned in sequence using the PR pattern as an etching mask, to form a gate electrode 60 and a gate dielectric film 58.

FIGS. 8B and 8C show the region in which an emitter contact is to be formed. As shown in FIGS. 8B and 8C, the polysilicon layer in this region is etched to the photoresist pattern PR, gate electrode 60, and gate insulation film 58 such that an $n^+$ source region to be formed does not contact the gate electrode 60.

As an alternative, after patterning the polysilicon layer of FIGS. 8B and 8C, as shown in FIG. 8A, the polysilicon layer of a region in which an emitter contact is to be formed is etched before a metal electrode is formed. As a result of this, the source region and the gate electrode do not contact each other in this region.

Figure 9A:
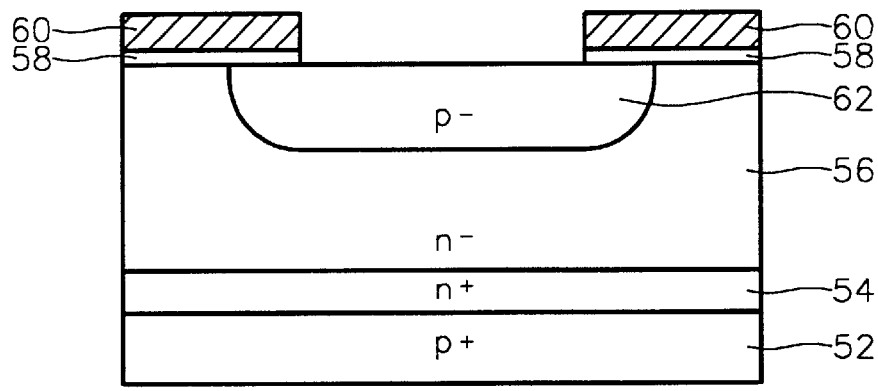
Figure 9B:
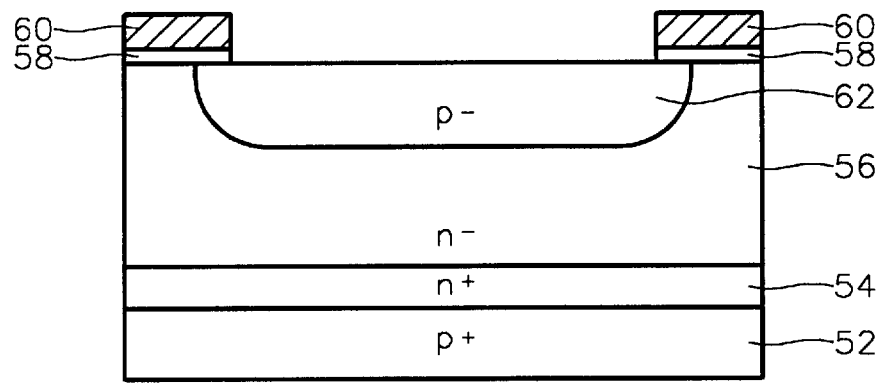
Figure 9C:
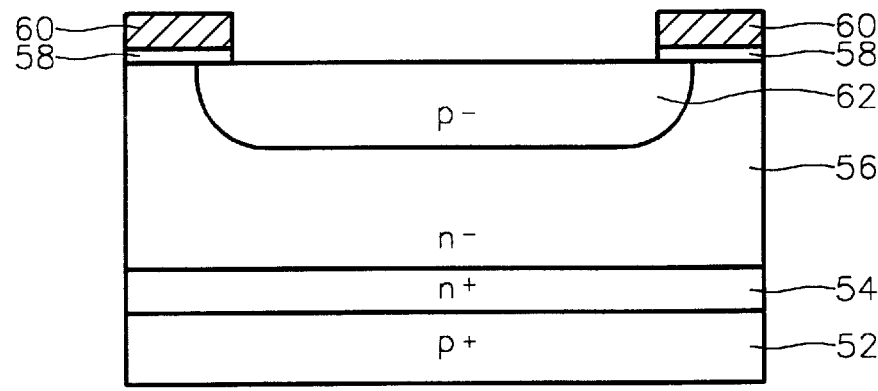

Referring to FIGS. 9A through 9C, after removing the PR pattern, p-type impurity ions, e.g., boron (B), are implanted into the $n^-$ semiconductor layer 56 using the gate electrode 60 as an ion implantation mask. A thermal process is then performed at a predetermined temperature to diffuse the impurity ions implanted into the $n^-$ semiconductor layer 56, thereby forming a $p^-$ well region 62.

Figure 10A:
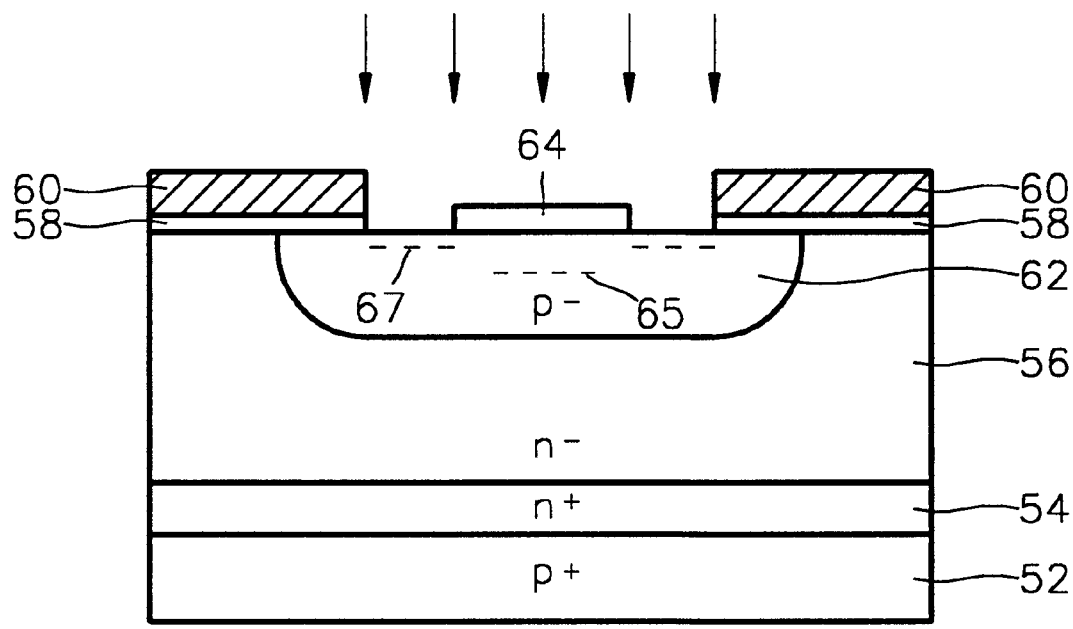
Figure 10B:
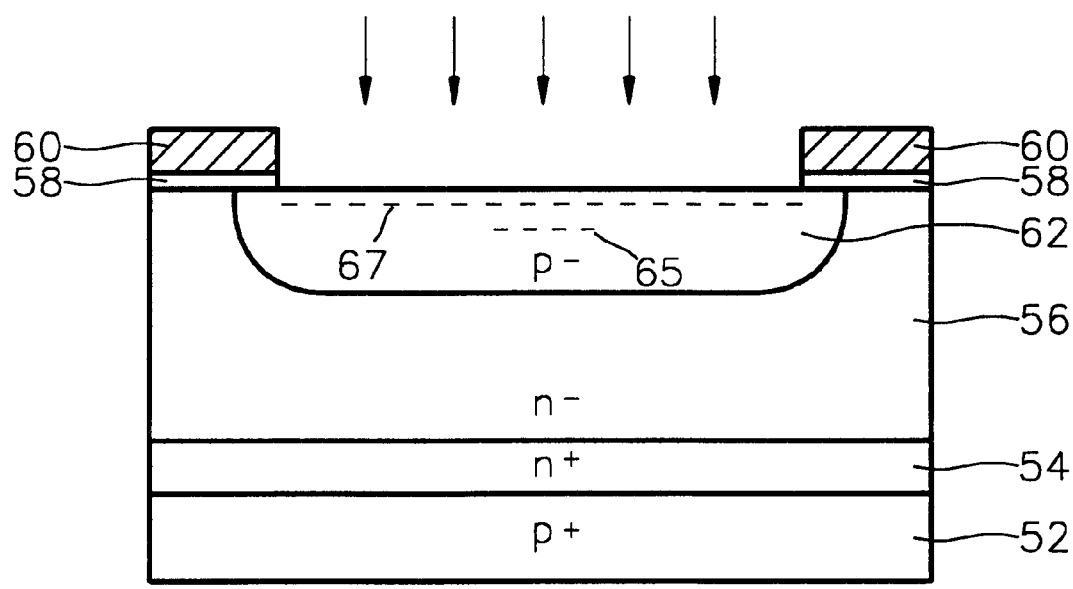
Figure 10C:
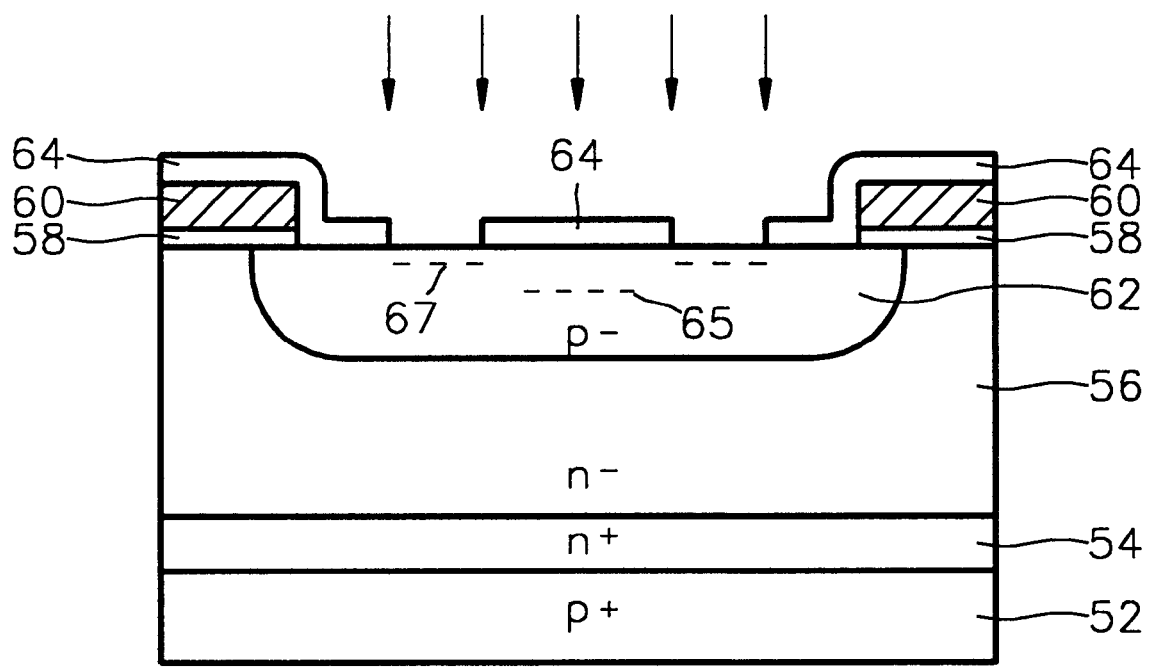

Referring to FIGS. 10A through 10C, after defining a region in which a $p^+$ well is to be formed, p-type impurity ions are implanted at a high concentration into the defined region using the second mask pattern 210 of FIG. 4. This forms a $p^+$ impurity layer 65 at a predetermined depth of the $p^-$ well region 62.

Next, an insulation film, e.g., a nitride layer, is deposited on the resultant structure having the $p^+$ impurity layer 65. The nitride layer is then patterned by photolithography using the third mask pattern 220 of FIG. 4. Then, a nitride layer pattern 64 having an opening is formed at a region in which a $n^+$ source region is to be formed. Then, n-type impurity ions are implanted at a high concentration into the p⁻ well region 62, using the nitride layer pattern 64 as an ion implantation mask. This forms an n⁺ impurity layer 67 for forming the source region. When implanting the n-type impurity ions, implantation energy is properly controlled such that the n⁺ impurity layer 67 is located between the p⁺ impurity layer 65 and the upper surface of the p⁻ well region 62.

Figure 11A:
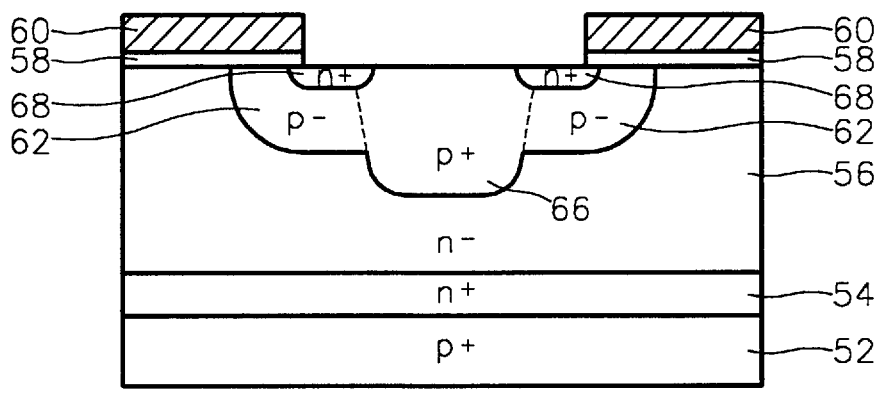
Figure 11B:
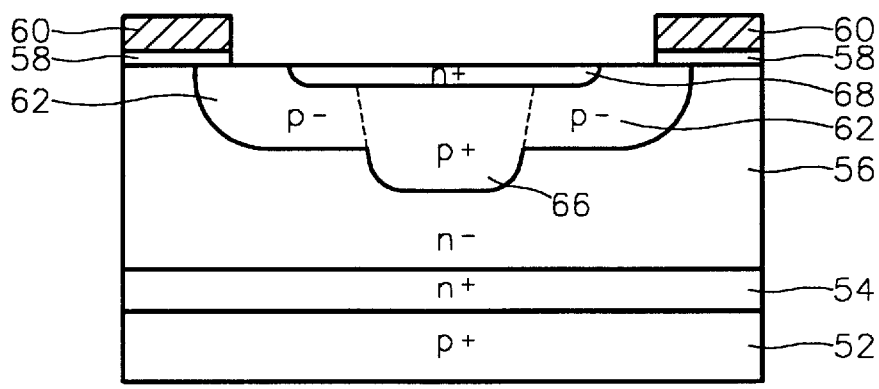
Figure 11C:
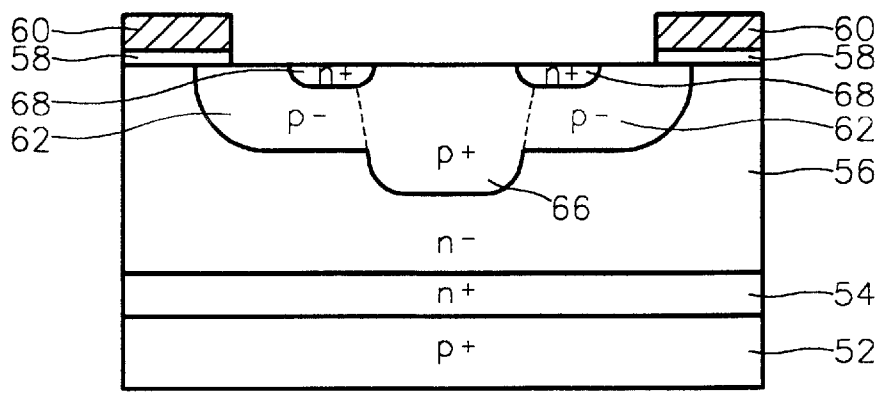

Referring to FIGS. 11A through 11C, the resultant structure described above is then heat-treated at a predetermined temperature so that the impurity ions implanted into the impurity layers 65 and 67 (see FIGS. 10A through 10C) are diffused. This results in an n⁺ source region 68 and a p⁺ well region 66 for controlling latch-up. Here, because of the different concentrations between the two impurity layers and the difference in diffusion rates between n-type and p-type impurity ions, the n⁺ source region 68 is thinly formed beneath the upper surface of the p⁻ well region 62. In addition, the p⁺ well region 66 for controlling the latch-up is extended to a part of the n⁻ semiconductor layer 56 via the p⁻ well region 62.

Also, since the gate electrode 60 is formed separate from the n⁺ source region 68 by a predetermined distance, the n⁺ source region 68 does not contact the gate electrode 60 in a region having the emitter contact. As a result, no channel is formed in that region, and so a parasitic thyristor does not operate.

Figure 12A:
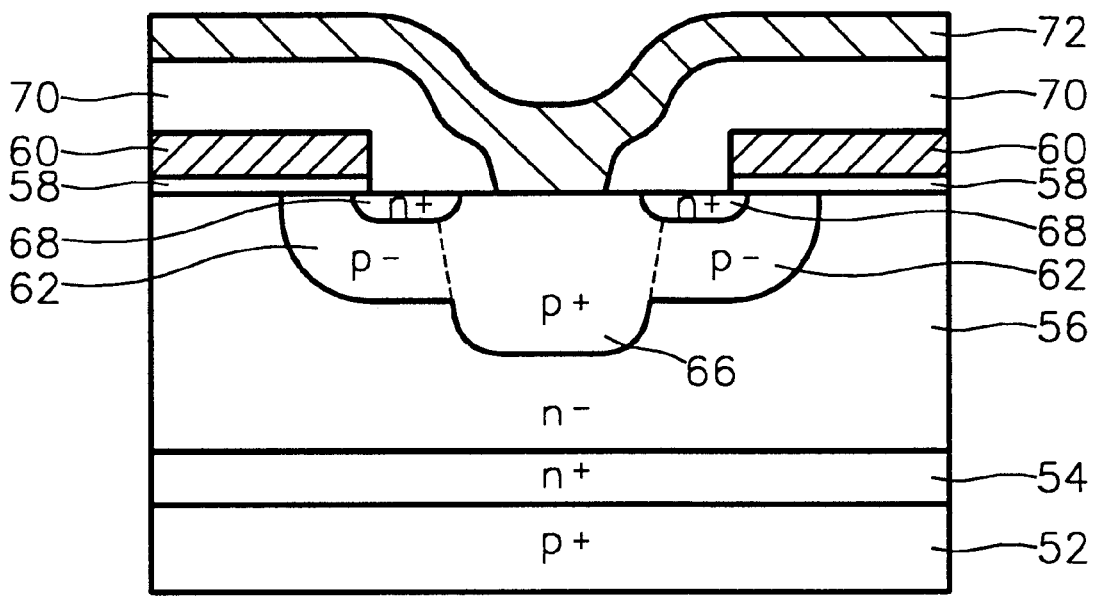
Figure 12B:
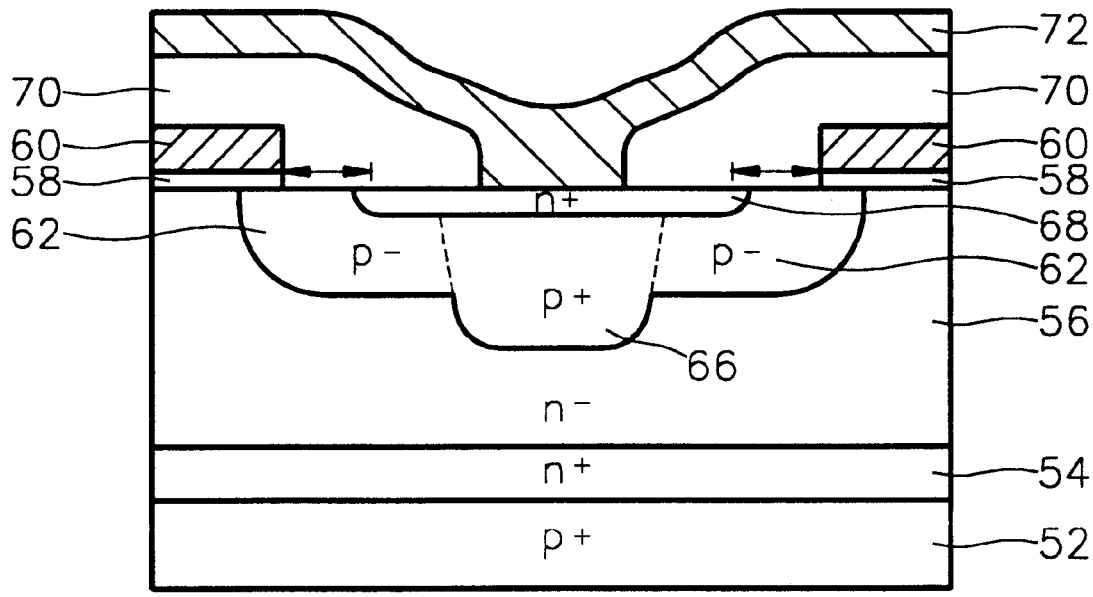
Figure 12C:
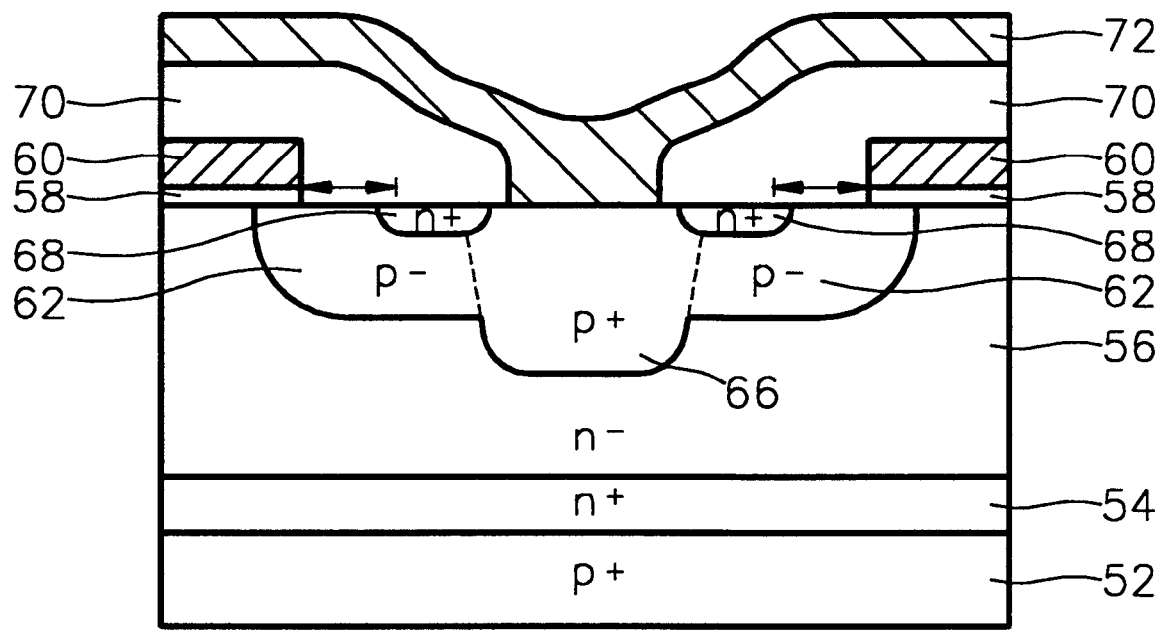

Referring to FIGS. 12A through 12C, after an insulation film 70, such as a phosphosilicate glass (PSG) layer, is deposited on the resultant structure having the p⁺ well region 66 and the n⁺ source region 68, the insulation film 70 is reflowed by a thermal process. The insulation film 70 is then patterned by photolithography using the fourth mask pattern 230 of FIG. 4. This forms a contact hole that exposes the n⁺ source region 68 and a part of the p⁺ well region 66.

A metal such as aluminum (Al) is then deposited on the resultant structure having the contact hole, and is patterned to form a metal electrode 72 connected to the n⁺ source region 68 and a part of the p⁺ well region 66.

Typical preferred embodiments of the invention have been disclosed in the drawings and specification. Although specific terms are employed, they are used in a generic and descriptive sense only, and not for purposes of limitation. The scope of the invention is set forth in the following claims.

As described above, in the IGBT and the method for manufacturing the same according to the present invention, the gate electrode is formed so as not to contact the n⁺ source region in a region having an emitter contact, such that no channel is formed in that region. Thus, the threshold voltage of the parasitic npn device is infinite in this region. For this reason, the current flowing from the n⁺ source region to the gate electrode is blocked. As a result, the latch-up can be prevented and the short circuit current characteristics can be effectively improved by simple process without an extra mask.

What is claimed is:

1. An insulated gate bipolar transistor (IGBT) comprising:
    a semiconductor substrate of a first conductive type;
    a primary semiconductor layer of a second conductive type, formed over the semiconductor substrate;
    a well of the first conductive type, formed beneath the surface of the primary semiconductor layer;
    a source region of the second conductive type formed in the well and doped with a high concentration, wherein the source region comprises first and second elongated source sections each extending in a first direction, the first and second elongated source sections being spaced apart in a second direction substantially perpendicular to the first direction and substantially in parallel to each other and being connected by a cross-bar source section extending between the first and second elongated source sections along a second direction;
    a metal electrode connected to the source region in the cross-bar source section; and
    an insulated gate electrode formed over the primary semiconductor layer, wherein the insulated gate electrode defines a recessed portion where the gate electrode does not overlap the source region, the recessed portion being disposed laterally in the first direction with respect to the cross-bar section,
    wherein the insulated gate electrode only extends over the source region outside of a cathode region in which a contact between the source region and the metal electrode is formed.

2. The IGBT of claim 1, wherein the insulated gate electrode does not extend over any portion of the source region lying along an axis extending in the second direction through a middle of the cross-bar source section.

3. The IGBT of claim 1, further comprising a highly-doped semiconductor layer of the second semiconductor type, formed over the semiconductor substrate.

* * * * *